(12) United States Patent
Chesler

(10) Patent No.: US 6,879,156 B1
(45) Date of Patent: Apr. 12, 2005

(54) REDUCING DEAD-TIME EFFECT IN MRI PROJECTION

(75) Inventor: David Chesler, Newton Highlands, MA (US)

(73) Assignee: The General Hospital Corporation, Boston, MA (US)

( * ) Notice: Subject to any disclaimer, the term of this patent is extended or adjusted under 35 U.S.C. 154(b) by 0 days.

(21) Appl. No.: 10/440,019

(22) Filed: May 16, 2003

Related U.S. Application Data

(60) Provisional application No. 60/381,152, filed on May 17, 2002.

(51) Int. Cl.[7] .................................................. G01V 3/00
(52) U.S. Cl. ...................................... 324/309; 324/307
(58) Field of Search ................................ 324/309, 307, 324/306, 312, 314, 318, 322, 300, 30

(56) References Cited

U.S. PATENT DOCUMENTS

| | | | |
|---|---|---|---|
| 4,707,658 A | | 11/1987 | Frahm et al. |
| 5,150,053 A | | 9/1992 | Pauly et al. |
| 5,245,282 A | | 9/1993 | Mugler, III et al. |
| 5,602,476 A | * | 2/1997 | Liu et al. .................. 324/309 |
| 6,185,444 B1 | | 2/2001 | Ackerman et al. |
| 6,268,728 B1 | * | 7/2001 | Morrell .................... 324/307 |
| 6,366,091 B1 | * | 4/2002 | Takahashi et al. ......... 324/309 |

FOREIGN PATENT DOCUMENTS

| | | |
|---|---|---|
| EP | 0 496 501 B1 | 4/1999 |
| WO | WO 99/45842 | 9/1999 |

OTHER PUBLICATIONS

Wu et al., "Multinuclear Solid–State three–dimensional MRI of Bone and Synthetic Calcium Phosphates," P.N.A.S. USA, vol. 96, No. 4, pp. 1574–1578 (1999).
Kuethe et al., "Transforming NMR Data Despite Missing Points," J. Magnetic Resonance, vol. 139, pp. 18–25 (1999).
Chesler, et al., Abstracts, Eleventh Annual Meeting of the Society of Magnetic Resonance in Medicine in Berlin, Germany, Aug. 8–13, 1992, 1992, p. 665.
Wu, et al., "Evaluation of Bone Mineral Density Using 3–Dimensional Solid State Phosphorus 3–1 NMR Projection Imaging," Calcified Tissue International, vol. 62, pp. 512–518, 1998.

* cited by examiner

*Primary Examiner*—Louis Arana
(74) *Attorney, Agent, or Firm*—Fish & Richardson P.C.

(57) ABSTRACT

A method for collecting data representative of a magnetic resonance image includes two or more data collection cycles in which different gradient fields are applied. A first data set collected in the first cycle leaves a portion of k-space inaccessible because of dead-time in the MRI machine. The second data set, collected in the presence of a different gradient, reaches back to populate a portion of the previously inaccessible portion of k-space.

36 Claims, 4 Drawing Sheets

REDUCING DEAD-TIME EFFECT IN MRI PROJECTION

CLAIM OF PRIORITY

This application claims priority under 35 USC §119(e) to U.S. Provisional Patent Application Ser. No. 60/381,152, filed on May 17, 2002, the entire contents of which are hereby incorporated by reference.

FEDERALLY SPONSORED RESEARCH OR DEVELOPMENT

The U.S. Government may have certain rights in this invention pursuant to grant numbers N1AS02R01 AR42258-006 and 5R01AG14701-15 awarded by the NIH.

FIELD OF INVENTION

This invention relates to magnetic resonance imaging ("MRI"), and in particular, the imaging of media having a short spin—spin relaxation time.

BACKGROUND

In the diagnosis of osteoporosis, it is useful to measure the ratio of inorganic mineral density to organic matrix density. This quantity, which is referred to as the "degree of bone mineralization," is now measured invasively. In histomorphometry, thin sections of bone are removed from a patient and examined under a microscope. Alternatively, samples of bone are subjected to destructive chemical analysis or biopsies.

Because of their difficulty, invasive methods such as these are undesirable for screening large numbers of people for osteoporosis. In addition, these methods require inferring the degree of bone mineralization using a limited number of samples.

Magnetic resonance imaging techniques are useful for imaging internal structures. Such techniques typically include placing a patient in a non-uniform magnetic field and applying an RF (radio-frequency) pulse. After the RF pulse is complete, one waits for short time before collecting data. The length of this wait, which is referred to as the "dead time," depends on how quickly the RF pulse decays to the point where data collection can safely begin.

After the dead time has elapsed, one can then collect data for a limited time, which is determined by the spin—spin relaxation time (often referred to as "T2" or "T2*"). The interval between the end of the dead-time and the end of the spin—spin relaxation time defines a data collection window.

When applied to solid, relatively dry structures, such as bone, MRI is hampered by extremely short spin—spin relaxation times. With the dead time now being an appreciable fraction of the spin—spin relaxation time, the data collection window becomes so short that the amount of data collected is insufficient for forming a useful image.

SUMMARY

The invention is based, in part, on the recognition that with an MRI machine, one can populate different portions of k-space by obtaining time samples in the presence of different magnetic fields. As a result, two sets of time samples taken at the same or similar times relative to an RF pulse but in the presence of different magnetic fields can populate different portions of k-space. This permits the using one set of samples to populate a portion of k-space rendered inaccessible to another set of samples because of the dead-time of an MRI machine.

In one aspect, the invention includes a method for collecting data representative of a magnetic resonance image from a region-of-interest. The method includes applying a first gradient field having a first gradient to the region-of-interest. While the first gradient field is applied, a first data set is collected from the region-of-interest. This first data set has first time samples separated from each other by a first time-sampling interval. A second gradient field is then applied to the region-of-interest. This second gradient field has a second gradient that differs from the first gradient. While the second gradient field is applied, a second data set is collected from the region-of-interest. This second data set has second time samples separated from each other by a second time-sampling interval. The second time-sampling interval can be the same as or different from the first time-sampling interval.

In one practice, at least one of the first and second time-sampling intervals is selected on the basis of the ratio between the first and second gradients.

In another practice of the invention, the first and second time-sampling intervals are separated in time such that first k-space samples corresponding to the first time samples and second k-space samples corresponding to the second time samples are separated in k-space by the same selected k-space-sampling interval. Optionally, the collection of the second data set is commenced at a time selected such that a k-space sample associated with a last time sample from the first data set and a k-space sample associated with a first time sample from the second data set are separated in k-space by a selected k-space-sampling interval. In a variant of this practice, the first and second time-sampling intervals are selected such that the k-space samples are located at integer multiples of the k-space sampling interval.

Another aspect of the invention includes a method for reducing data loss resulting from dead time during the operation of an MRI machine. The method includes applying, to a region-of-interest, a first gradient field having a first gradient and applying, to that region-of-interest, a first RF pulse. After a dead time following application of the first RF pulse, a first set of time samples is collected from the region-of-interest. A second gradient field is then applied to the region-of-interest. The second gradient field has a second gradient different from the first gradient. After a dead time following application of a second RF pulse, a second set of time samples is collected from the region-of-interest.

Another aspect of the invention features a method for populating k-space with samples using an MRI machine. In this case, a first magnetic field is applied to a region-of-interest and a first set of time samples is collected from that region-of-interest. A first subset of k-space is then populated on the basis of the first set of time samples. A second magnetic field that differs from the first magnetic field is then applied to the region-of-interest and a second set of time samples is collected from the region-of-interest. On the basis of the second set of time samples, a second subset of k-space is populated. This second subset includes a portion of k-space excluded from the first subset.

Additional aspects of the invention include computer-readable media having encoded thereon instructions for causing a magnetic resonance imaging system to carry out the methods described herein.

Yet other aspects of the invention include magnetic resonance imaging systems configured to carry out the methods described herein, and magnetic resonance imaging systems equipped with computer-readable media having encoded thereon instructions for causing the magnetic resonance imaging system to carry out the methods set forth above.

Unless otherwise defined, all technical and scientific terms used herein have the same meaning as commonly understood by one of ordinary skill in the art to which this invention belongs. Although methods and materials similar or equivalent to those described herein can be used in the practice or testing of the present invention, suitable methods and materials are described below. All publications, patent applications, patents, and other references mentioned herein are incorporated by reference in their entirety. In case of conflict, the present specification, including definitions, will control. In addition, the materials, methods, and examples are illustrative only and not intended to be limiting.

Other features and advantages of the invention will be apparent from the following detailed description, and from the claims.

The relative lengths of pulses shown in the figures are not to scale.

DETAILED DESCRIPTION

Figure 1:
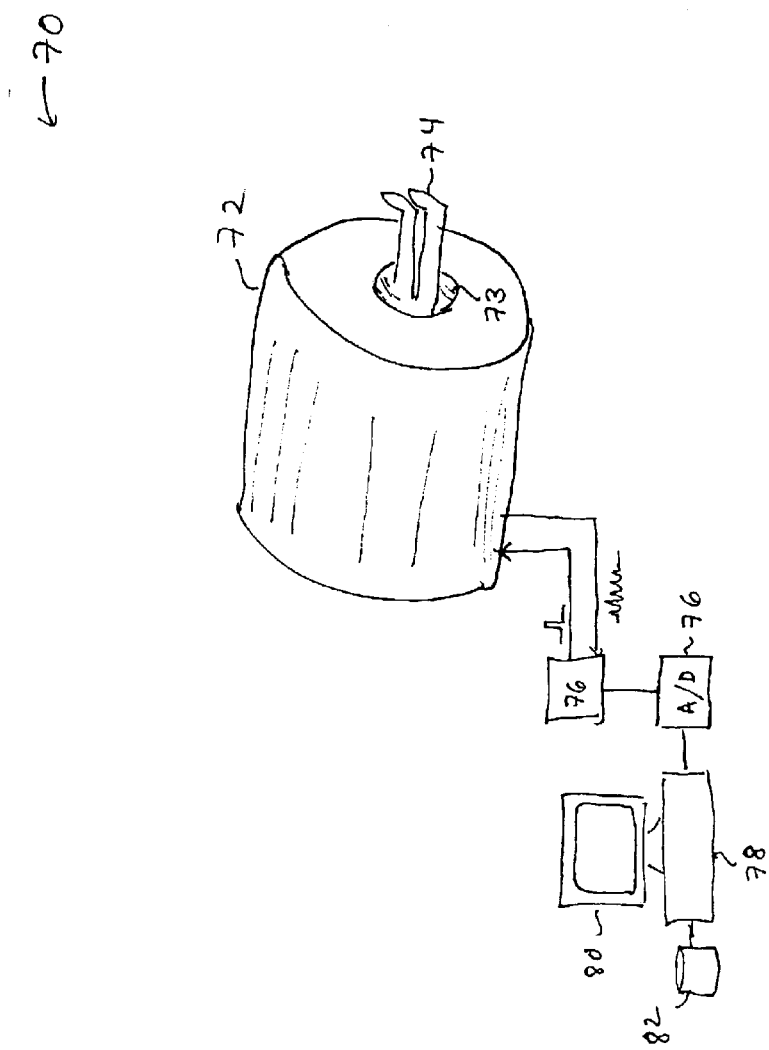
FIG. 1 is diagram of the major components of an MRI machine.

As shown in FIG. 1, a magnetic resonance imaging ("MRI") system 70 includes an annular housing 72 having an aperture 73 into which a patient 74 is inserted. The housing 72 contains within it a magnet subsystem (not shown) for generating magnetic fields within the aperture 73. These fields include the spatially uniform field, often designated as "$B_o$," and gradient fields that vary spatially in selected directions by selected amounts. The total field within the aperture 73 will be referred to as the "net magnetic field."

The housing 72 includes an antenna subsystem (not shown) for transmitting a radio-frequency ("RF") pulse and for detecting a free induction decay ("FID") signal generated by the nuclear spins within the patient 74. The antenna subsystem is connected to an RF signal generator 76 that generates the RF pulse, and to an A/D converter 76 that samples the resulting FID signal. A computer system 78 in data communication with the A/D converter 76 receives the resulting time samples of the FID signal and uses them to form an image on a display 80.

In an effort to obtain the best possible image in the shortest time, one can vary such parameters as the strengths and orientations of the magnetic fields, their durations, their spatial distributions, the number and separation between samples, the length, shape, and frequency of the RF pulse, when the RF pulse is to begin and end, and when the samples are to be taken. The orchestration of all these parameters is typically controlled by the computer system 78 executing instructions stored on a computer-readable medium 82 and connected to each of the subsystems that make up the MRI system 70.

The first step in obtaining a magnetic resonance image is to expose a portion of the patient to the $B_o$ field. This $B_o$ field defines a magnetization axis about which nuclear spins precess. Since the $B_o$ field is spatially uniform, the nuclear spins all precess at their respective Larmor frequencies.

Figure 3:
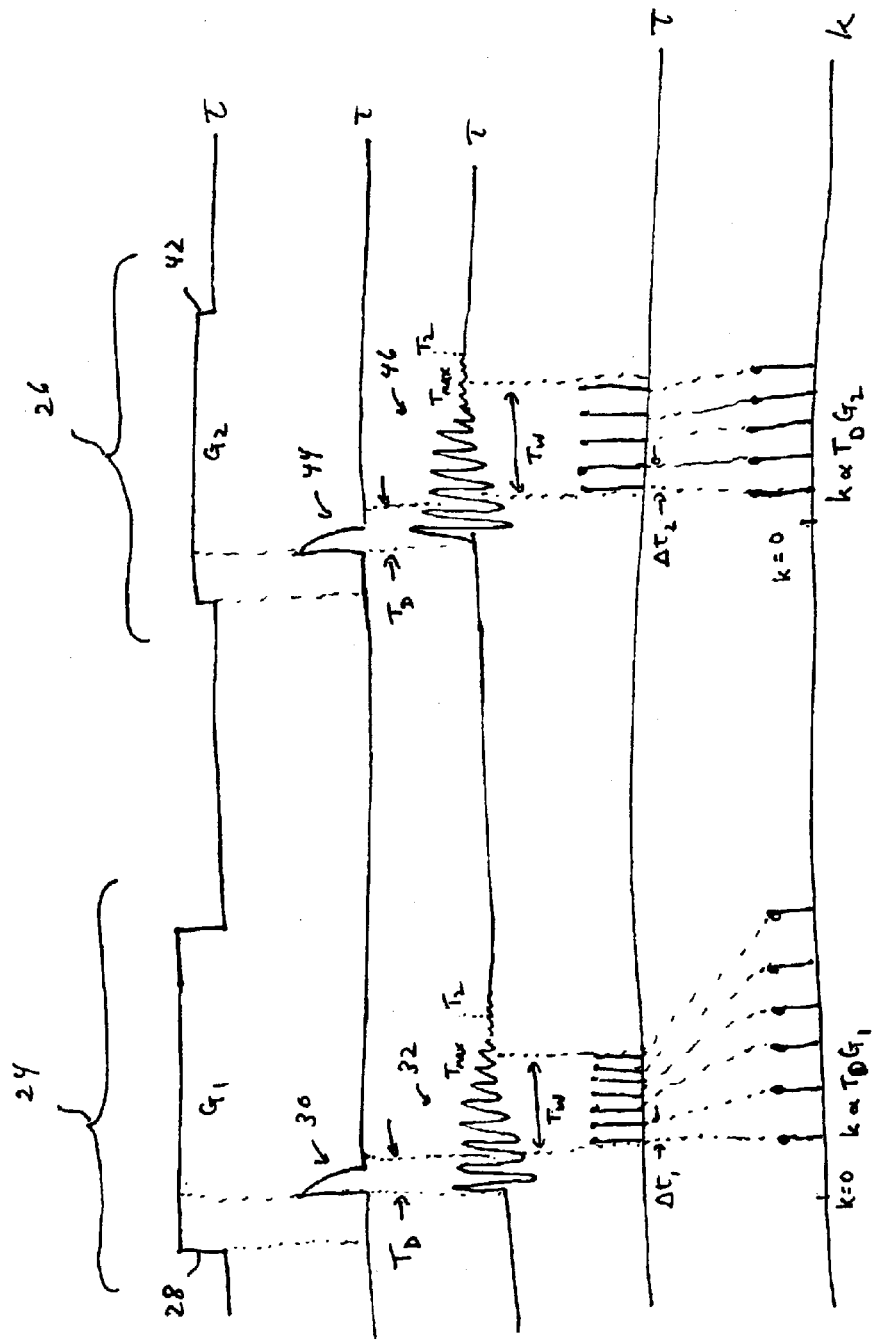
FIG. 3 is a pulse sequence that includes two data-collection cycles with different gradients.

Referring now to FIG. 3, to start a data-collection cycle for determining the spatial distribution of anatomical structures along a particular direction, one superimposes, on the $B_o$ field, a gradient field 10 that varies linearly along a desired direction. The rate at which the gradient field varies in space, G, will be referred to as the "gradient." The magnetic field, which is now the sum of the $B_o$ field and the gradient field, is thus no longer spatially uniform. Consequently, the nuclear spins no longer precess at the same frequency regardless of their location. Instead, they precess at frequencies indicative of their locations relative to the applied gradient field.

After an interval 12, the duration of which is selected to allow eddy currents to decay (e.g. 1 millisecond), one applies a brief RF (radio frequency) pulse 14. The field generated by the RF pulse 14 is directed to briefly re-orient the nuclear spins along a direction transverse to the magnetization axis. Once the RF pulse 14 is complete, the nuclear spins slowly re-orient themselves along the magnetization axis.

As the nuclear spins rotate in the transverse plane, they cause emission of an FID signal 16. It is this signal that ultimately provides data for generating an image.

After a short time, referred to as the "spin—spin relaxation time," or "$T_2$" ("$T_2^*$" where the magnetic field has additional local inhomogeneities), the FID signal 16 decays to the point at which it can no longer provide useful data. Thus, all data should be collected during a data collection window that ends at or before the spin—spin relaxation time. In practice, data is acquired during a data collection window ending at an end time $T_{max}$ that is short of the spin—spin relaxation time.

An additional constraint arises because the RF pulse 14 does not vanish immediately. Instead, the RF pulse 14 decays with a decay time characteristic of the electronics used to generate the pulse 14. In most MRI machines, the decay time, or "dead time" (shown as TD in FIGS. 2 and 3) is on the order of 10 to 100 microseconds. If one attempts to receive the FID signal 16 during this dead time, the residual field due to the decaying RF pulse 14 may interfere with the FID signal, or may damage the highly sensitive circuitry used to receive the FID signal 16.

Figure 2:
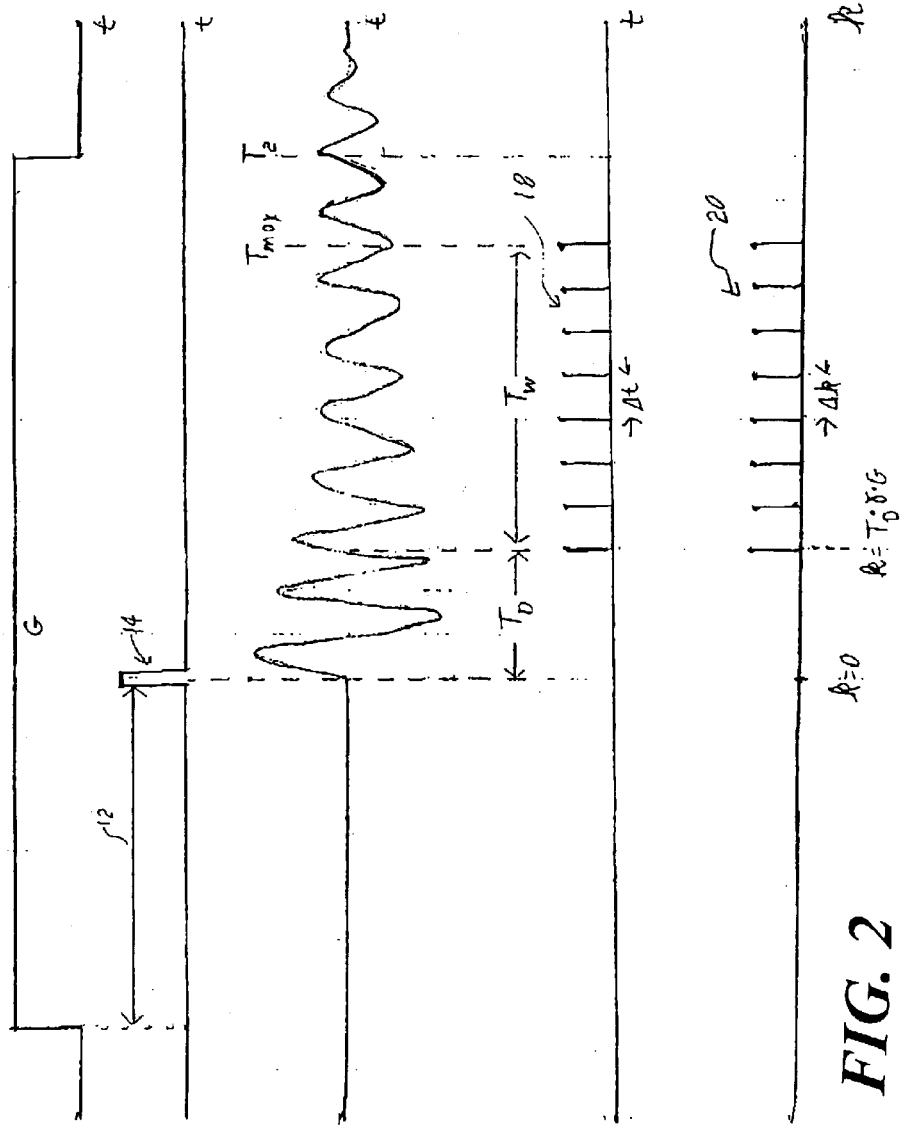
FIG. 2 is a pulse sequence for one data-collection cycle.

It is apparent, therefore, that the extent of the data-collection window, shown as $T_w$ in FIGS. 2 and 3, depends on the difference between the spin—spin relaxation time and the dead time $T_D$. In solid structures, such as bone, the spin—spin relaxation time is on the order of only about 200 microseconds. Thus, when imaging bone, the dead time becomes an appreciable fraction of the spin—spin relaxation time. In this case, postponing data collection until after the dead time can significantly degrade the image.

Data collection proceeds by obtaining a set of time samples 18 of the FID signal, the time samples 18 being separated from each other by a time-sampling interval, $\Delta t$ (e.g. on the order of 5–10 microseconds). The value of each such time sample 18 represents the value of the three-dimensional Fourier transform of the spatial distribution of nuclear spins. The coordinate system of the three-dimensional Fourier transform, in which the independent variable is a spatial frequency, is often referred to as "k-space." Associated with each time sample 18 is a k-space sample 20 at a corresponding position in the three-dimensional k-space. The position, in k-space, of the k-space sample 20 associated with a particular time sample 18 depends on the time at which the time sample 18 was obtained and on the gradient field. In particular, a vector $\vec{k}$ from the origin of k-space to the position corresponding to a time sample 18 taken at time t in the presence of a gradient field $\vec{G}$ is given by:

$$\vec{k} = t \cdot \gamma \cdot \vec{G}$$

where γ is the gyromagnetic ratio. A set of k-space samples 20 lying along a line defined by a particular G vector will be referred to as a "projection." The k-space samples along a projection are separated by a k-space sampling interval:

$$\Delta k = \gamma \cdot G \cdot \Delta t$$

Because sampling can only be commenced after the dead time has elapsed, there inevitably exists a dead-time interval on the time axis that contains no time samples. Consequently, there exists a corresponding unused interval on the k-space axis that also contains no k-space samples. The invention provides a method of shrinking the unused interval on the k-space axis without changing the dead-time interval on the time axis. This is achieved by repeating the foregoing procedure but with a different applied gradient field.

Referring to FIG. 3, a data collection method for carrying out the invention includes first and second data-collection cycles 24, 26, each of which is as discussed above in connection with FIG. 2. A difference between the first and second data-collection cycles 24, 26 lies in the different applied gradients.

The first data-collection cycle 24 begins with the application of a first gradient field 28 having a first gradient $G_1$. After applying an RF pulse 30, and beginning after the dead time has elapsed, a resulting first FID signal 32 is sampled at sampling times separated by a first time-sampling interval 34. This results in a first set of time samples 36 beginning after a first dead-time interval.

Corresponding to the first set of time samples 36 is a first set of k-space samples 38 separated from each other by a first k-space-sampling interval 40. This first set of k-space samples 38 begins following a first unused interval in k-space. The extent of the first k-space-sampling interval depends on the first time-sampling interval 34 and on the magnitude of the first gradient field 28. The method of the invention is intended to populate at least a portion of this first unused interval with k-space samples.

Following an interval selected to allow some spin-lattice relaxation, (e.g. on the order of ½ second), the second data-collection cycle 26 begins with application of a second gradient field 42. This second gradient field 42 has a second gradient $G_2$ that is less than the first gradient $G_1$ of the first gradient field 28. A second RF pulse 44 identical to the first is then applied. This results in a second FID signal 46. Once the dead time has lapsed, the second FID signal 46 is sampled at sampling times separated by a second time-sampling interval 48. This results in a second set of time samples 50. The dead time, being a property of the hardware, is the sane in both the first and second data-collection cycles 24, 26. Hence, the second set of time samples 50 begins following a second dead-time interval that is the same as the first dead-time interval.

The second set of time samples 50 results in a corresponding second set of k-space samples 52 separated by a second k-space-sampling interval 54. These k-space samples 52 begin after a second unused interval in k-space. However, although the first and second dead-time intervals are the same, the first and second unused intervals are not. This is because the mapping between the time domain and the k-space domain depends in part on the gradient field. Since the respective first and second gradients 28 and 42, are different, the mapping between the time domain and the k-space domain will also be different. In particular, because the second gradient 42 is less than the first gradient 28, the second unused interval is shorter than the first unused interval. As a result, a portion of k-space that was left unpopulated by k-space samples 38 in the first data-collection cycle 24 can now be populated by k-space samples 52 in the second data-collection cycle 26.

The extent of the second k-space-sampling interval depends on the second time-sampling interval 48 and on the second gradient 42. Preferably, but not necessarily, the second time-sampling interval 48 is selected so that the first and second k-space-sampling intervals 40, 54 are equal. In the more general case, where there are additional data collection cycles, it is preferable that the time sampling intervals for each successive data-collection cycle be selected such that the k-space sampling intervals are the same for each data collection cycle. This is achieved by setting the time-sampling interval for the $i^{th}$ data-collection cycle to be:

$$\Delta t_i = \Delta t_1 \cdot \left( \frac{G_1}{G_i} \right)$$

where $\Delta t_i$ and $G_i$ are the time-sampling interval and the gradient field, respectively, for the $i^{th}$ data-collection cycle, and $\Delta t_i$ and $G_i$ are the time-sampling interval and the gradient field, respectively, for the first data-collection cycle.

In addition, the sampling times are preferably, but not necessarily, selected such that the k-space-sampling interval between a last k-space sample in the second set of k-space samples 52 and a first k-space sample in the first set of k-space samples 38 equals the first and second k-space-sampling intervals 40, 54. This will result in a seamless transition between the first and second sets 38, 52 of k-space samples.

Finally, it is preferable to start obtaining time samples at a time selected such that the distance between the first k-space sample and the origin of k-space is an integer multiple of the k-space sampling interval. This is achieved by selecting the start time $T_D$ for the first data collection cycle to be the smallest time greater than or equal to the dead time TD for which the ratio $T_{start,1}/\Delta t_i$ is an integer. Successive data-collection cycles are then begun at start times $T_{start,i}$ that are the smallest times greater than or equal to the dead time $T_D$ for which the ratio $T_{start,i}/\Delta t_i$ is an integer.

The foregoing description discloses a procedure for determining the spatial distribution of spin along one direction by obtaining k-space samples along a projection in k-space that lies in that direction. In three-dimensional MRI, the foregoing procedure is carried out on many such projections, the directions of which are uniformly distributed through the three-dimensional space. Each projection provides information on the spatial distribution of spin along a corresponding direction.

Figure 4:
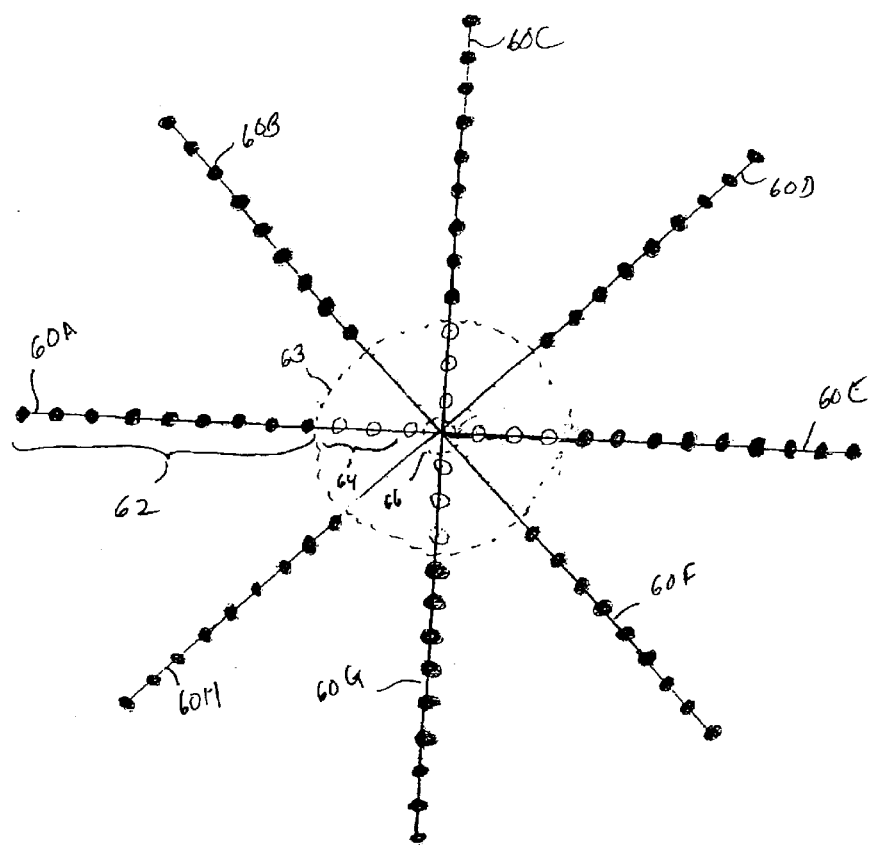
FIG. 4 is a cross-section of k-space showing collected samples.

FIG. 4 shows a cross-section through a 3-dimensional k-space showing eight projections 60A–H, each of which extends radially outward from the k-space origin. k-space samples 62 collected during the first data-collection cycle 24 are shown as filled points. These k-space samples 62 come no closer to the origin than the radius of a first dead sphere 63. The radius of the first dead sphere 63 depends on the dead time and on the gradient 28 present during the first data-collection cycle 24. K-space samples 64 collected during the second data-collection cycle 26 are shown as unfilled points 64. These k-space samples 64 occupy a volume of k-space between the first dead sphere and a second dead sphere 66 having a radius that depends on the gradient 42 present during the second data-collection cycle 26.

As shown in FIG. 4, the projections 60A–H are uniformly spaced in k-space. However, this need not be the case. In addition, the second data-collection cycle 26 need not be carried out on each projection 60A–H. For example, in FIG. 4, the second data-collection cycle 26 is carried out only on every other projection 60A, 60C, 60E, 60G. Finally, the second data-collection cycle 26 can be carried out on projections for which no first data-collection cycle 24 has been carried out. In all these cases, the essential point is that the second data-collection cycle 26 provides a direct measurement of k-space samples within a volume of k-space that was unavailable during the first data-collection cycle 24.

Although the second unused interval is shorter than the first unused interval, it nevertheless has a finite extent. As a result, even after the second data-collection cycle 26 there will continue to be a volume in k-space that cannot be sampled because of the finite dead time. In FIG. 4, this volume is contained within the second dead sphere 66. This volume can be reduced further by executing additional data-collection cycles as set forth above. In practice however, it has been found that two data-collection cycles 24, 26 are sufficient to provide acceptable images for measurement of bone mineralization.

The number of projections 60 required depends on the desired field of view and resolution. In particular, $$P = \pi \left( \frac{FOV}{RES} \right)^2$$

where P is the number of projections 60, FOV is the diameter of the desired field of view, and RES is the desired resolution.

The magnitude of the first gradient 28 is given by $$|G_1| = \frac{1}{2\gamma T_{max} RES}$$

where $T_{max}$ is the end time, $\gamma$ is the gyromagnetic ratio, and RES is the desired resolution.

The first time-sampling interval $\Delta t_1$ satisfies the inequality $$\Delta t_1 \leq \frac{1}{2|G|\gamma FOV}$$

For the second data-collection cycle 26, or more generally, for each subsequent data-collection cycle, the magnitude of the gradient 42 is multiplied by the factor, $$\frac{T_D}{T_{MAX}}$$

and the number of projections 60 for which data is collected is reduced by a factor of $$\left( \frac{T_D}{T_{MAX}} \right)^2$$

K-space samples from different data-collection cycles are combined into the same three-dimensional k-matrix. To compensate for the different k-space sampling densities, samples from the $i^{th}$ data-collection cycle are weighted by a factor of $$\frac{P_1 \cdot \Delta t_i}{P_i \cdot \Delta t_1}$$

where $\Delta t_i$ is the sampling interval for the $i^{th}$ data-collection cycle and $P_i$ is the number of projections 60 in the $i^{th}$ data-collection cycle.

The final data-collection cycle is that in which the magnitude of the gradient $G_i$ is small enough to satisfy the inequality $$T_D \leq \frac{1}{2 \cdot \gamma \cdot FOV \cdot |G_i|}$$

Note that the number of projections 60 per data-collection cycle decreases geometrically and that the maximum ratio of the total data collection time to the data collection time for the first data-collection cycle 24 is:

$$\frac{1}{\left( 1 - \left( \frac{T_D}{T_{MAX}} \right)^2 \right)}$$

Once data from all data-collection cycles is combined into the same three-dimensional k-matrix, processing proceeds as if only one data-collection cycle had occurred. Details of such processing are known and set forth in, e.g., Chesler, et al., Abstracts, Eleventh Annual Meeting of the Society of Magnetic Resonance in Medicine in Berlin, Germany, Aug. 8–13, 1992, p. 665, and in Wu, et al., "Evaluation of Bone Mineral Density Using 3-Dimensional Solid State Phosphorus 3-1 NMR Projection Imaging," Calcified Tissue International, vol. 62, pp. 512–518, 1998. The contents of both of the foregoing references are herein incorporated by reference.

The invention can be implemented in hardware or software, or a combination of both. The invention can be implemented in computer programs using standard programming techniques following the method steps and figures described herein. The programs should be designed to execute on programmable computers each comprising a processor, a data storage system (including memory and/or storage elements), at least one input device, and at least one output device, such as a CRT or printer. Program code is applied to input data to perform the functions described herein and generate output information. The output information is applied to one or more output devices such as a CRT, as described herein.

Each program is preferably implemented in a high level procedural or object oriented programming language to communicate with a computer system. However, the programs can be implemented in assembly or machine language, if desired. In any case, the language can be a compiled or interpreted language.

Each such computer program is preferably stored on a storage medium or device (e.g., ROM or magnetic diskette)

readable by a general or special purpose programmable computer, for configuring and operating the computer when the storage media or device is read by the computer to perform the procedures described herein. The system can also be considered to be implemented as a computer-readable storage medium, configured with a computer program, where the storage medium so configured causes a computer to operate in a specific and predefined manner to perform the functions described herein.

Other Embodiments

It is to be understood that while the invention has been described in conjunction with the detailed description thereof, the foregoing description is intended to illustrate and not limit the scope of the invention, which is defined by the scope of the appended claims. Other aspects, advantages, and modifications are within the scope of the following claims.

I claim:

1. A method for collecting data representative of a magnetic resonance image of a region-of-interest, the method comprising:

applying a first gradient field to the region-of-interest, the first gradient field having a first gradient;

while the first gradient field is applied, collecting, from the region-of-interest, a first data set having first time samples of a first free-induction decay stimulated by a first RF excitation pulse, the first time samples being separated from each other by a first time-sampling interval;

applying a second gradient field to the region-of-interest, the second gradient field having a second gradient differing from the first gradient; and while the second gradient field is applied, collecting, from the region of interest, a second data set the second data set having second time samples of a second free-induction decay stimulated by a second RF excitation pulse, the second time samples being separated from each other by a second time-sampling interval.

2. The method of claim 1, further comprising selecting at least one of the first and second time-sampling intervals on the basis of the ratio between the first and second gradients.

3. The method of claim 1, further comprising selecting the first and second time-sampling intervals such that first k-space samples corresponding to the first time samples and second k-space samples corresponding to the second time samples are separated in k-space by the same selected k-space-sampling interval.

4. The method of claim 3, further comprising beginning the collection of the second data set at a time selected such that a k-space sample associated with a last time sample from the first data set and a k-space sample associated with a first time sample from the second data set are separated in k-space by the selected k-space-sampling interval.

5. The method of claim 3, further comprising selecting the first and second time-sampling intervals such that the k-space samples are located at integer multiples of the k-space sampling interval.

6. A magnetic resonance imaging system configured to execute the method recited in claim 1.

7. A method for reducing data loss resulting from dead time in a magnetic resonance imaging system, the method comprising:

applying a first gradient field to a region-of-interest, the first gradient field having a first gradient;

applying a first radio frequency pulse to the region-of-interest, thereby stimulating a first free-induction decay;

after a dead time following application of the first radio frequency pulse, collecting a first set of time samples of the first free-induction decay from the region-of-interest;

applying a second gradient field to the region-of-interest, the second gradient field having a second gradient different from the first gradient;

applying a second radio frequency pulse to the region-of-interest, thereby stimulating a second free-induction decay; and after a dead time following application of the second radio frequency pulse, collecting a second set of time samples of the second free-induction decay from the region-of-interest.

8. The method of claim 7, wherein collecting a first set of time samples comprises selecting a first time sampling interval between time samples, and collecting a second set of time samples comprises selecting a second time sampling interval between time samples, wherein at least one of the first and second time sampling intervals is selected on the basis of a ratio between the first and second gradients.

9. The method of claim 8, wherein collecting a first set of time samples comprises selecting a first time sampling interval between time samples, and collecting a second set of time samples comprises selecting a second time sampling interval between time samples, wherein at least one of the first and second time sampling intervals is selected such that first k-space samples corresponding to the first time samples, and second k-space samples corresponding to the second time samples are separated in k-space by the same selected k-space-sampling interval.

10. The method of claim 9, further comprising beginning the collection of the second set of time samples at a time selected such that a k-space sample associated with a last time sample from the first set of time samples, and a k-space sample associated with a first time sample from the second set of time samples are separated in k-space by the selected k-space-sampling interval.

11. The method of claim 10, further comprising selecting the first and second time sampling intervals such that the k-space samples are located at integer multiples of the selected k-space sampling interval.

12. A magnetic resonance imaging system configured to execute the method recited in claim 7.

13. In a magnetic resonance imaging machine, a method of populating k-space with samples, the method comprising:

applying a first magnetic field to a region-of-interest;

collecting a first set of time samples of a first free-induction decay signal from the region-of-interest;

populating a first subset of k-space on the basis of the first set of time samples; and applying a second magnetic field to the region-of-interest, the second magnetic field being different from the first magnetic field;

collecting a second set of time samples of a second free-induction decay signal from the region-of-interest; and populating a second subset of k-space on the basis of the second set of time samples, the second subset including a portion of k-space excluded from the first subset.

14. The method of claim 13, wherein applying a first magnetic field comprises applying a gradient field having a first gradient, and applying a second magnetic field comprises applying a gradient field having a second gradient that differs from the first gradient.

15. The method of claim 13 wherein collecting a first set of time samples comprises collecting time samples separated by a first time-sampling interval and collecting a second set of time samples comprises collecting time samples separated by a second time-sampling interval, wherein the first and second time-sampling intervals are selected on the basis of the first and second magnetic fields.

16. The method of claim 15 further comprising selecting the first and second time-sampling intervals to uniformly populate the k-space.

17. The method of claim 16, further comprising selecting the first and second time-sampling intervals to generate k-space samples located at integer multiples of a k-space sampling interval.

18. A magnetic resonance imaging system configured to execute the method recited in claim 13.

19. A computer-readable medium having encoded thereon software for collecting data representative of a magnetic resonance image of a region-of-interest, the software comprising instructions for causing a magnetic resonance imaging system to:

apply a first gradient field to the region-of-interest, the first gradient field having a first gradient;

while the first gradient field is applied, collect, from the region-of-interest, a first data set having first time samples of a first free-induction decay stimulated by a first RF excitation pulse, the first time samples being separated from each other by a first time-sampling interval;

apply a second gradient field to the region-of-interest, the second gradient field having a second gradient differing from the first gradient; and while the second gradient field is applied, collect, from the region-of-interest, a second data set, the second data set having second time samples of a second free-induction decay stimulated by a second RF excitation pulse, the second time samples being separated from each other by a second time-sampling interval.

20. The computer-readable medium of claim 19, wherein the software further comprises instructions for causing the magnetic resonance imaging system to select at least one of the first and second time-sampling intervals on the basis of the ratio between the first and second gradients.

21. The computer-readable medium of claim 19, wherein the software further comprises instructions for causing the magnetic resonance imaging system to select the first and second time-sampling intervals such that first k-space samples corresponding to the first time samples, and second k-space samples corresponding to the second time samples are separated in k-space by the same selected k-space-sampling interval.

22. The computer-readable medium of claim 21, wherein the software further comprises instructions for causing the magnetic resonance imaging system to begin the collection of the second data set at a time selected such that a k-space sample associated with a last time sample from the first data set and a k-space sample associated with a first time sample from the second data set are separated in k-space by the selected k-space-sampling interval.

23. The computer-readable medium of claim 21, wherein the software further comprises instructions for causing the magnetic resonance imaging system to select the first and second time-sampling intervals such that the k-space samples are located at integer multiples of the k-space sampling interval.

24. A magnetic resonance imaging system comprising a computer-readable medium as recited in claim 19.

25. A computer-readable medium having encoded thereon software for reducing data loss resulting from dead time in a magnetic resonance imaging system, the software comprising instructions for causing a magnetic resonance imaging system to:

apply a first gradient field to a region-of-interest, the first gradient field having a first gradient;

apply a first radio frequency pulse to the region-of-interest, thereby stimulating a first free-induction decay;

after a dead time following application of the first radio frequency pulse, collect a first set of time samples of the first free-induction decay from the region-of-interest;

apply a second gradient field to the region-of-interest, the second gradient field having a second gradient different from the first gradient;

apply a second radio frequency pulse to the region-of-interest, thereby stimulating a second free-induction decay; and after a dead time following application of the second radio frequency pulse, collect a second set of time samples of the second free-induction decay from the region-of-interest.

26. The computer-readable medium of claim 25, wherein the instructions for causing the magnetic resonance imaging system to collect a first set of time samples comprise instructions for causing the magnetic resonance imaging system to select a first time sampling interval between time samples, and the instructions for causing the magnetic resonance imaging system to collect a second set of time samples comprise instructions for causing the magnetic resonance imaging system to select a second time sampling interval between time samples, wherein at least one of the first and second time sampling intervals is selected on the basis of a ratio between the first and second gradients.

27. The computer-readable medium of claim 26, wherein the instructions for causing the magnetic resonance imaging system to collect a first set of time samples comprise instructions for causing the magnetic resonance imaging system to select a first time sampling interval between time samples, and the instructions for causing the magnetic resonance imaging system to collect a second set of time samples comprise instructions for causing the magnetic resonance imaging system to select a second time sampling interval between time samples, wherein at least one of the first and second time sampling intervals is selected such that first k-space samples corresponding to the first time samples, and second k-space samples corresponding to the second time samples are separated in k-space by the same selected k-space-sampling interval.

28. The computer-readable medium of claim 27, wherein the software further comprises instructions for causing the magnetic resonance imaging system to begin the collection of the second set of time samples at a time selected such that a k-space sample associated with a last time sample from the first set of time samples, and a k-space sample associated with a first time sample from the second set of time samples are separated in k-space by the selected k-space-sampling interval.

29. The computer-readable medium of claim 28, wherein the software further comprises instructions for causing the magnetic resonance imaging system to select the first and second time sampling intervals such that the k-space samples are located at integer multiples of the selected k-space sampling interval.

30. A magnetic resonance imaging system comprising a computer-readable medium as recited in claim 25.

31. A computer-readable medium having encoded thereon instructions for causing a magnetic resonance imaging system to populate k-space with samples, the software comprising instructions for causing the magnetic resonance imaging system to:

apply a first magnetic field to a region-of-interest;

collect a first set of time samples of a first free-induction decay signal from the region-of-interest;

populate a first subset of k-space on the basis of the first set of time samples; and apply a second magnetic field to the region-of-interest, the second magnetic field being different from the first magnetic field;

collect a second set of time samples of a second free-induction decay signal from the region-of-interest; and populate a second subset of k-space on the basis of the second set of time samples, the second subset including a portion of k-space excluded from the first subset.

32. The computer-readable medium of claim 31, wherein the instructions for causing the magnetic resonance imaging system to apply a first magnetic field comprise instructions for causing the magnetic resonance imaging system to apply a gradient field having a first gradient, and the instructions for causing the magnetic resonance imaging system to apply a second magnetic field comprise instructions for causing the magnetic resonance imaging system to apply a gradient field having a second gradient that differs from the first gradient.

33. The computer-readable medium of claim 31, wherein the instructions for causing the magnetic resonance imaging system to collect a first set of time samples comprise instructions for causing the magnetic resonance imaging system to collect time samples separated by a first time-sampling interval, and the instructions for causing the magnetic resonance imaging system to collect a second set of time samples comprise instructions for causing the magnetic resonance imaging system to collect time samples separated by a second time-sampling interval, wherein the first and second time-sampling intervals are selected on the basis of the first and second magnetic fields.

34. The computer-readable medium of claim 33 wherein the software further comprises instructions for causing the magnetic resonance imaging system to select the first and second time-sampling intervals to uniformly populate the k-space.

35. The computer-readable medium of claim 34, wherein the software further comprises instructions for causing the magnetic resonance imaging system to select the first and second time-sampling intervals to generate k-space samples located at integer multiples of a k-space sampling interval.

36. A magnetic resonance imaging system comprising a computer-readable medium as recited in claim 31.

* * * * *